(12) United States Patent
Nakagawa

(10) Patent No.: US 8,885,188 B2
(45) Date of Patent: Nov. 11, 2014

(54) COMMUNICATION SYSTEM FOR TRANSMITTING MULTIPLE PULSE SIGNALS, TRANSMISSION CIRCUIT, RECEPTION CIRCUIT, AND IMAGE FORMING APPARATUS

(75) Inventor: Atsushi Nakagawa, Toride (JP)

(73) Assignee: Canon Kabushiki Kaisha, Tokyo (JP)

(*) Notice: Subject to any disclaimer, the term of this patent is extended or adjusted under 35 U.S.C. 154(b) by 208 days.

(21) Appl. No.: 13/552,299

(22) Filed: Jul. 18, 2012

(65) Prior Publication Data

US 2013/0038891 A1 Feb. 14, 2013

(30) Foreign Application Priority Data

Aug. 8, 2011 (JP) .................. 2011-173277

(51) Int. Cl.
| | |
|---|---|
| G06K 15/00 | (2006.01) |
| H02P 8/40 | (2006.01) |
| H03M 9/00 | (2006.01) |
| G06K 15/02 | (2006.01) |
| H04J 3/06 | (2006.01) |
| G06F 3/12 | (2006.01) |
| H04N 1/00 | (2006.01) |

(52) U.S. Cl.
CPC ........ *G06K 15/02* (2013.01); *H02P 8/40* (2013.01); *H03M 9/00* (2013.01); *H04J 3/06* (2013.01)
USPC .......................... 358/1.14; 358/1.15; 358/425

(58) Field of Classification Search
USPC .......... 358/1.1, 1.4, 1.5, 1.6, 1.14, 1.16, 1.17, 358/1.18, 425, 426.09
See application file for complete search history.

(56) References Cited

U.S. PATENT DOCUMENTS

2011/0197089 A1 8/2011 Nakagawa et al.

FOREIGN PATENT DOCUMENTS

JP 2000-324896 A 11/2000

*Primary Examiner* — Thierry L Pham
(74) *Attorney, Agent, or Firm* — Fitzpatrick, Cella, Harper & Scinto

(57) ABSTRACT

A communication system includes a transmitter and receiver. The transmitter includes a detector configured to detect an error amount of an edge position of a pulse signal caused by sampling; and a multiplexer configured to include a value indicating the detected error amount in a multiplexed signal. The receiver includes a demultiplexer configured to demultiplex the multiplexed signal and output a value indicating an amplitude of the pulse signal and the value indicating the error amount of the pulse signal; and a corrector configured to correct an edge position of the pulse signal using the error amount of the pulse signal, where the edge position is obtained from the value indicating the amplitude of the pulse signal output from the demultiplexer.

4 Claims, 10 Drawing Sheets

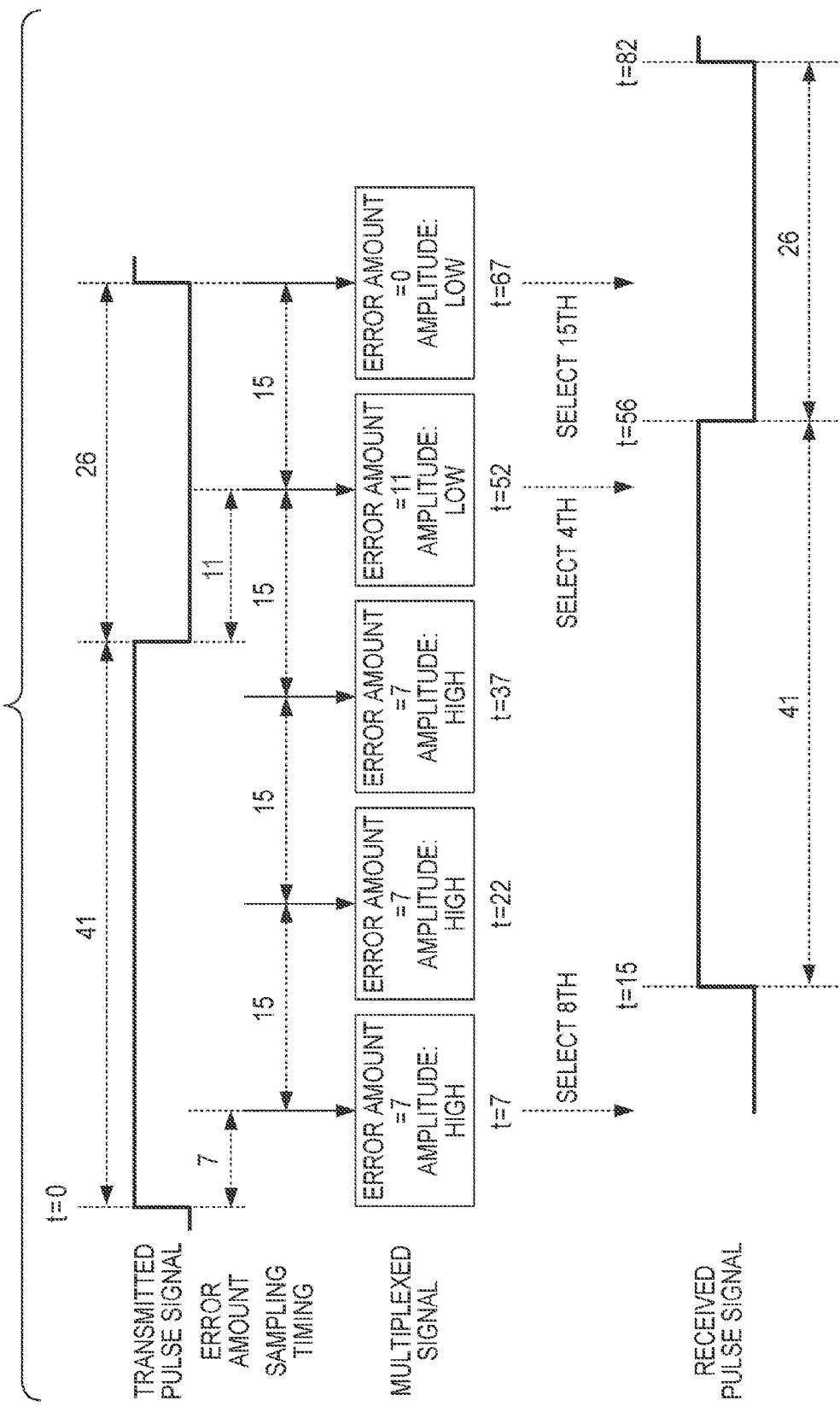

FIG. 5

| TIME | SHIFT REGISTER | | | | | | | | | | | | | | | |
|---|---|---|---|---|---|---|---|---|---|---|---|---|---|---|---|---|
| | 0 | 1 | 2 | 3 | 4 | 5 | 6 | 7 | 8 | 9 | 10 | 11 | 12 | 13 | 14 | 15 |
| 7 | 1 | 0 | 0 | 0 | 0 | 0 | 0 | 0 | 0 | 0 | 0 | 0 | 0 | 0 | 0 | 0 |
| ... | | | | | | | | ... | | | | | | | | |
| 14 | 1 | 1 | 1 | 1 | 1 | 1 | 1 | 1 | 0 | 0 | 0 | 0 | 0 | 0 | 0 | 0 |
| 15 | 1 | 1 | 1 | 1 | 1 | 1 | 1 | 1 | 1 | 0 | 0 | 0 | 0 | 0 | 0 | 0 |
| ... | | | | | | | | ... | | | | | | | | |
| 52 | 0 | 1 | 1 | 1 | 1 | 1 | 1 | 1 | 1 | 1 | 1 | 1 | 1 | 1 | 1 | 1 |
| ... | | | | | | | | ... | | | | | | | | |
| 55 | 0 | 0 | 0 | 0 | 1 | 1 | 1 | 1 | 1 | 1 | 1 | 1 | 1 | 1 | 1 | 1 |
| 56 | 0 | 0 | 0 | 0 | 1 | 1 | 1 | 1 | 1 | 1 | 1 | 1 | 1 | 1 | 1 | 1 |
| ... | | | | | | | | ... | | | | | | | | |
| 67 | 1 | 0 | 0 | 0 | 0 | 0 | 0 | 0 | 0 | 0 | 0 | 0 | 0 | 0 | 0 | 0 |
| ... | | | | | | | | ... | | | | | | | | |
| 82 | 1 | 1 | 1 | 1 | 1 | 1 | 1 | 1 | 1 | 1 | 1 | 1 | 1 | 1 | 1 | 1 | ated with drivers for pulse motors. Japanese Patent Laid-Open No.
COMMUNICATION SYSTEM FOR TRANSMITTING MULTIPLE PULSE SIGNALS, TRANSMISSION CIRCUIT, RECEPTION CIRCUIT, AND IMAGE FORMING APPARATUS

BACKGROUND OF THE INVENTION

1. Field of the Invention

The present invention relates to a communication system that transmits a plurality of pulse signals, a transmission circuit and a reception circuit included in the communication system, and an image forming apparatus including the communication system.

2. Description of the Related Art

An image forming apparatus uses, for example, a plurality of pulse motors having excellent positional control properties to convey papers. The speed of pulse motors is indicated by a pulse width. In recent years, control therefor has become complicated and the circuit size of a pulse signal generator has become large.

In view of the above, Japanese Patent Laid-Open No. 2000-324896 discloses a configuration shown in FIG. 9 where the circuit size is restrained by providing a pulse signal generator in a controller that centrally controls the apparatus, instead of providing pulse signal generators in correspondence with drivers for pulse motors. Japanese Patent Laid-Open No. 2000-324896 further discloses a configuration where the transmitting end executes parallel-serial (PS) conversion for time-division multiplexing on a plurality of pulse signals to reduce communication lines for transmitting the pulse signals to the drivers. In this case, as shown in FIG. 9, the receiving end obtains the pulse signals for the drivers by executing serial-parallel (SP) conversion.

However, in the case where sampling and time-division multiplexing are executed on the pulse signals, the pulse widths of the pulse signals restored by the receiving end may differ from the pulse widths of the pulse signals at the transmitting end. This phenomenon is described below with reference to FIG. 10. Referring to FIG. 10, the high level and the low level of the transmitted pulse signal both last for five unit times, and PS conversion is executed on the transmitted pulse signal while sampling the transmitted pulse signal at a sampling interval of three unit times. Note that the solid arrows shown in FIG. 10 indicate sampling timings. Meanwhile, the receiving end restores the received pulse signal using the sampled values, and therefore the pulse width of the received pulse signal differs from the pulse width of the transmitted pulse signal as shown in FIG. 10.

In a signal whose pulse width represents a control parameter, fluctuations in the pulse width mean occurrence of control errors. For example, in the case of control for the aforementioned pulse motors, fluctuations in the pulse widths lead to errors in the speed of conveyance of papers, and such errors may give rise to asynchronism depending on properties of the pulse motors. Although it is possible to shorten a sampling period to suppress fluctuations in the pulse widths, doing so increases the speed of the multiplexed signal and therefore requires measures against noise such as shielding of communication lines or differential transmissions, thus leading to a significant cost increase.

SUMMARY OF THE INVENTION

The present invention provides a communication system that multiplexes a plurality of pulse signals and suppresses fluctuations in the pulse widths without increasing the speed of the multiplexed signal, a transmission circuit and a reception circuit included in the communication system, and an image forming apparatus including the communication system.

According to an aspect of the present invention, a communication system includes a transmitter configured to generate and transmit a multiplexed signal for a plurality of pulse signals, the multiplexed signal including a value indicating an amplitude of each pulse signal of the plurality of pulse signals at a sampling timing; and a receiver configured to receive the multiplexed signal and output the plurality of pulse signals. The transmitter includes a detector configured to detect an error amount of an edge position of a pulse signal caused by sampling; and a multiplexer configured to include a value indicating the detected error amount in the multiplexed signal. The receiver includes a demultiplexer configured to demultiplex the multiplexed signal and output a value indicating an amplitude of the pulse signal and the value indicating the error amount of the pulse signal; and a corrector configured to correct an edge position of the pulse signal using the error amount of the pulse signal, the edge position being obtained from the value indicating the amplitude of the pulse signal output from the demultiplexer.

Further features of the present invention will become apparent from the following description of exemplary embodiments with reference to the attached drawings.

BRIEF DESCRIPTION OF THE DRAWINGS

FIG. 4 shows a timing chart according to one embodiment;

FIG. 5 shows values of bits in a shift register;

DESCRIPTION OF THE EMBODIMENTS

Figure 8:
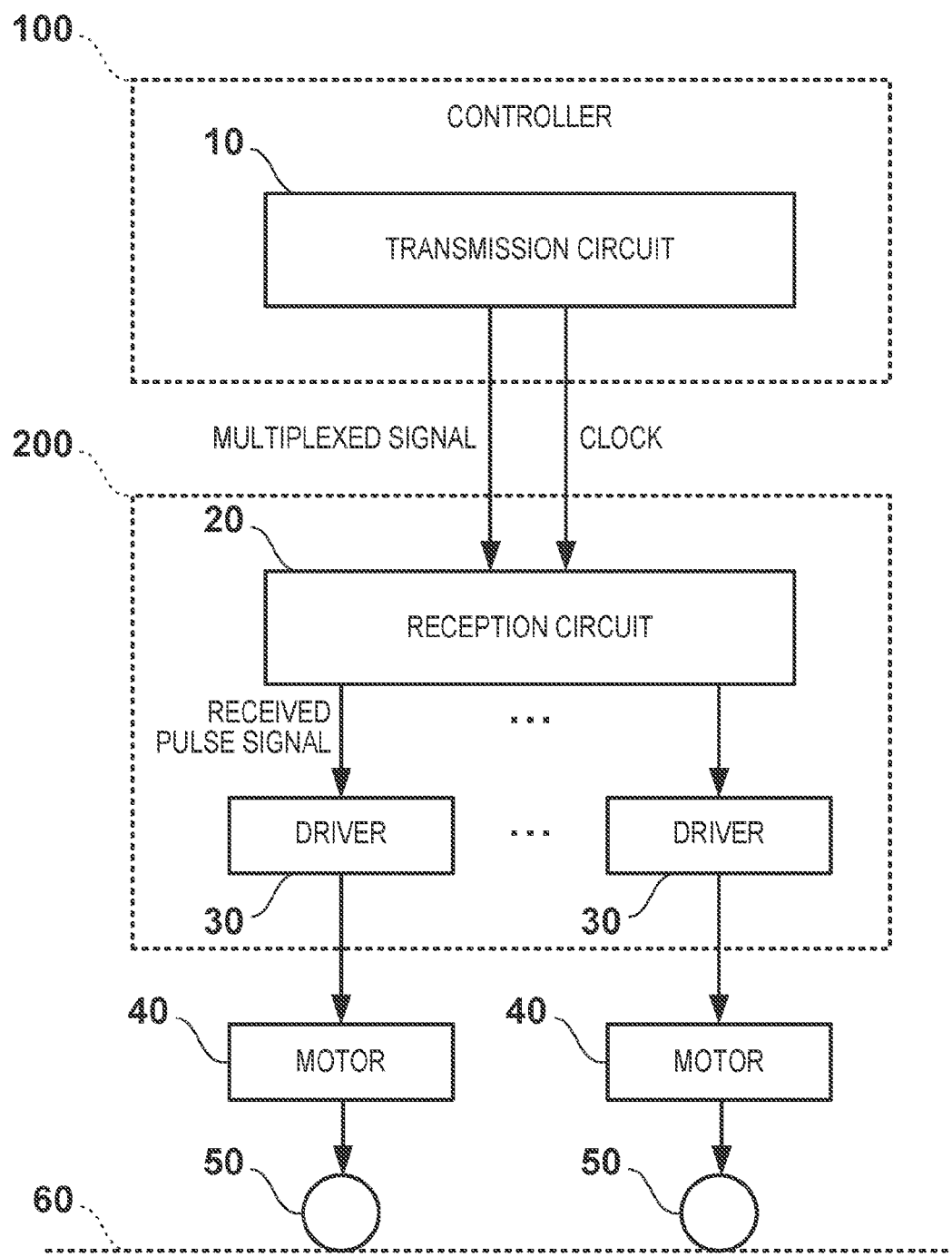
FIG. 8 shows a configuration of a communication system according to one embodiment.
Figure 9:
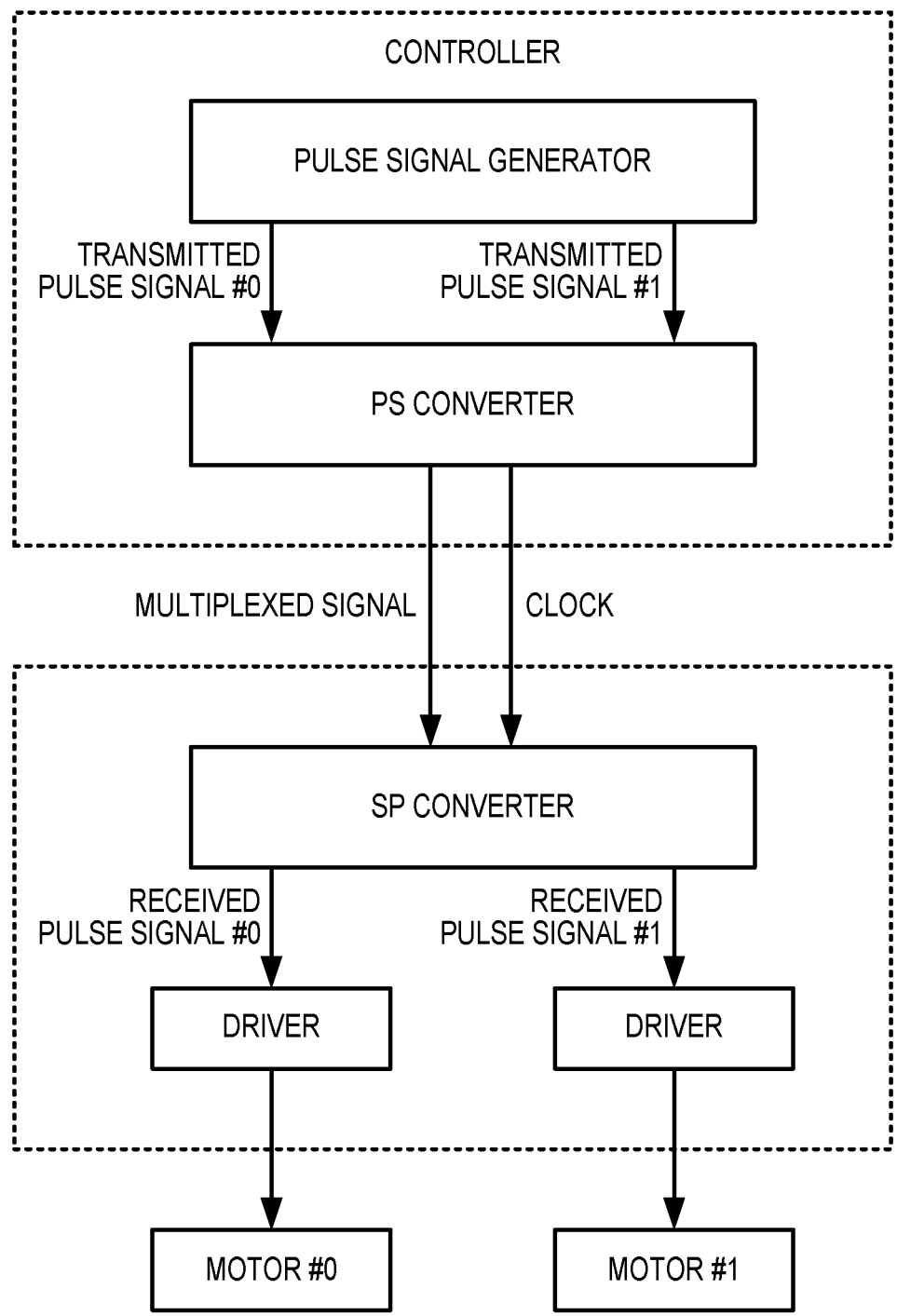
FIG. 9 shows a configuration in which pulse signals are multiplexed and transmitted.
Figure 10:
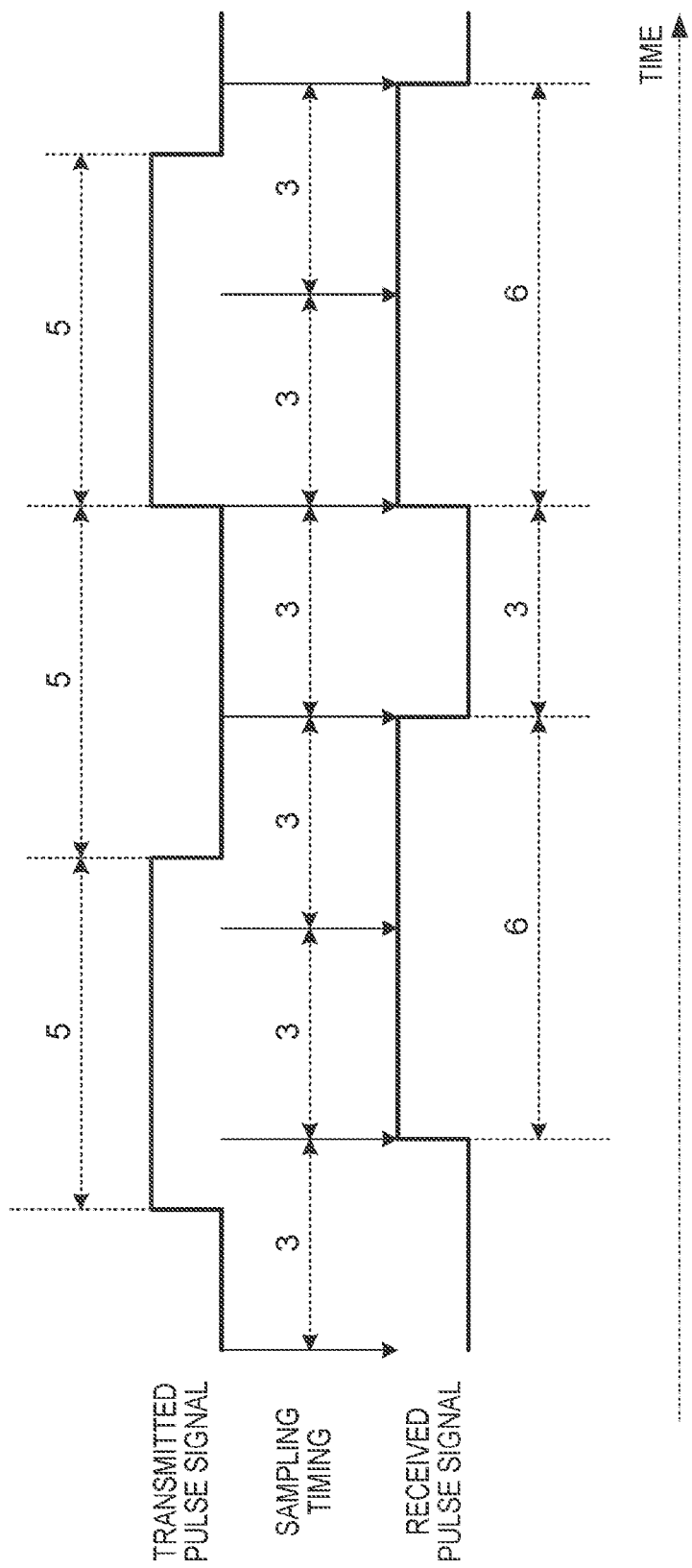
FIG. 10 is a diagram for explaining fluctuations in a pulse width caused by multiplexed transmission.

FIG. 8 shows a configuration of a serial communication system according to the present embodiment. It should be noted that image forming processing executed by an image forming apparatus is not necessary for the explanation of the present invention, and a description thereof is thus omitted. Referring to FIG. 8, each pulse motor 40 rotates a corresponding roller 50 to convey recording materials along a conveyance path 60. A transmission circuit 10 in a controller 100 generates pulse signals for controlling the speeds of the pulse motors 40 and transmits, to a drive controller 200, a multiplexed signal generated by multiplexing sampled values of the generated pulse signals and a clock signal corresponding to the speed of the multiplexed signal. A reception circuit 20 in the drive controller 200 restores the pulse signals for controlling the motors 40 based on the multiplexed signal and the clock signal received from the transmission circuit 10, and outputs the pulse signals to corresponding drivers 30. The drivers 30 drive the corresponding pulse motors 40 based on the pulse signals received from the reception circuit 20.

Figure 1:
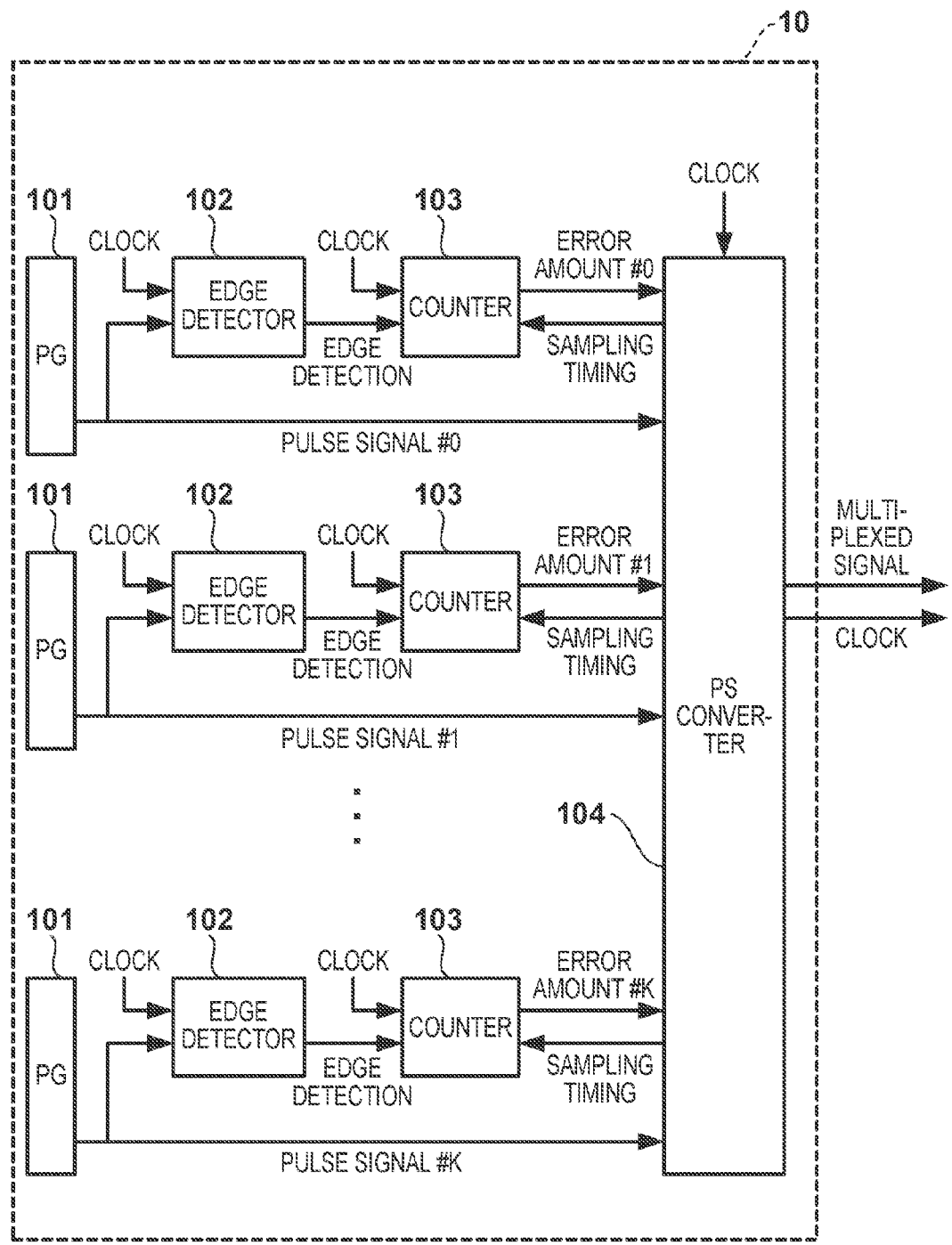
FIG. 1 shows a configuration of a transmission circuit according to one embodiment.

FIG. 1 shows a configuration of the transmission circuit 10. Note that the configuration shown in FIG. 1 is for the case where a plurality of (K) independent pulse signals are generated and transmitted. Furthermore, clock signals shown in FIG. 1 are all synchronized with one another, that is to say, they have the same speed. Pulse signal generators (PGs) 101 generate pulse signals for controlling the corresponding pulse motors 40. Edge detectors 102 detect changes in the amplitudes of the pulse signals, namely edges of the pulse signals, at timings of the clock signals and notify them to counters 103. Note that the timings of the clock signals denote any timing that can be identified from the clock signals, such as rising and falling edges of the clock signals. Upon detection of the edges by the edge detectors 102, the counters 103 count the clock signals until they are notified of the sampling timings from a parallel-serial (PS) converter 104. That is to say, each counter 103 counts a delay between detection of an edge position of the pulse signal and detection of the next sampling timing with the use of the clock signals. The counters 103 output the count values to the PS converter 104 as error amounts. In this way, the edge detectors 102 and the counters 103 function as edge error amount detectors that detect error amounts of edge positions caused by sampling.

Figure 3A:
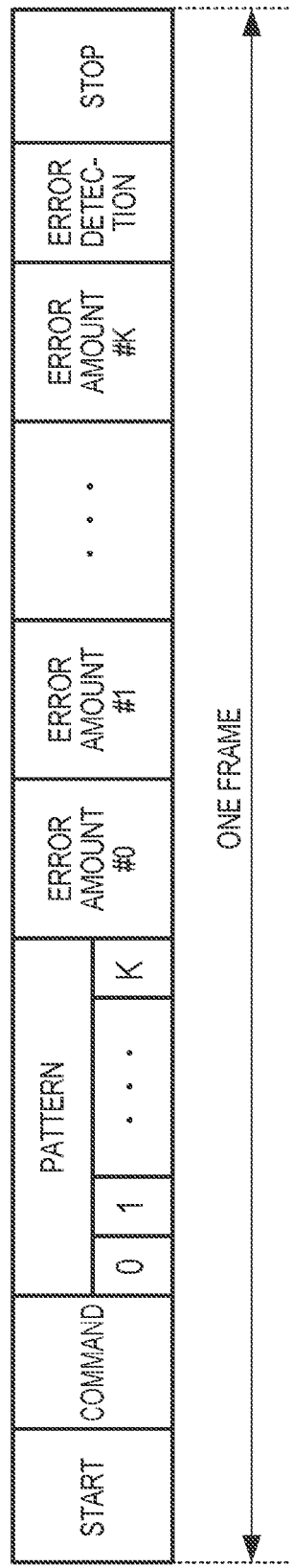
FIGS. 3A and 3B show structures of a multiplexed signal according to one embodiment.
Figure 3B:
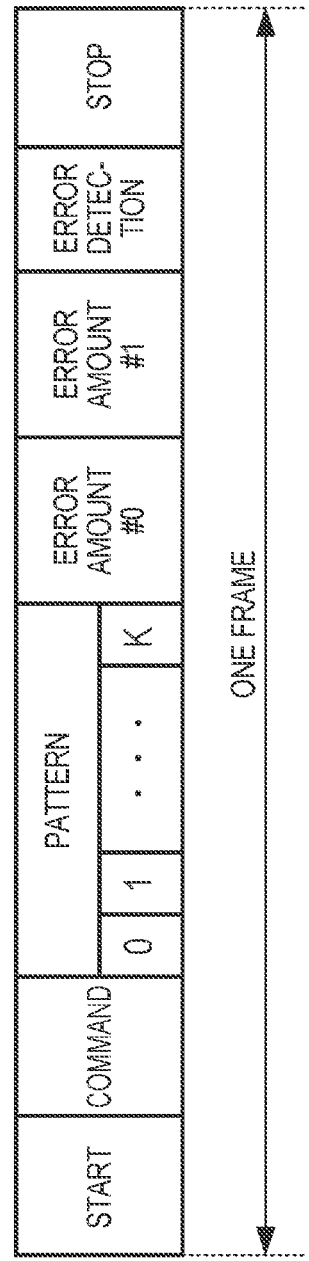

The PS converter 104 is a multiplexer that collects a value indicating an amplitude of each pulse signal and an error amount of each pulse signal at each sampling timing, and generates a multiplexed signal by multiplexing these values. The PS converter 104 transmits the generated multiplexed signal and a clock signal to the reception circuit 20. FIGS. 3A and 3B respectively show a configuration of a multiplexed signal. One frame begins with a start bit and ends with a stop bit. Each frame is transmitted at every sampling interval. The value indicating the number of signals that have been multiplexed is set in a command field. FIG. 3A shows a frame structure for the case where the command field indicates that K pulse signals have been multiplexed, whereas FIG. 3B shows a frame structure for the case where the command field indicates that two pulse signals have been multiplexed. By including the number of signals that have been multiplexed in the command field, the number of values of error amounts to be transmitted can be reduced to the number of pulse signals that are actually used, and therefore transmission of unnecessary data can be avoided. A Pattern field indicates whether a value of each pulse signal is high or low. The error amount counted by each counter 103 in correspondence with the pulse signal is set in an error amount field. Furthermore, a parity bit or the like for error detection is set in an error detection field. In the present embodiment, between the time when each counter 103 starts the count upon newly detecting an edge and the time when it finishes the count at the sampling timing, it outputs the previous count value to the PS converter 104 as the error amount.

Figure 2:
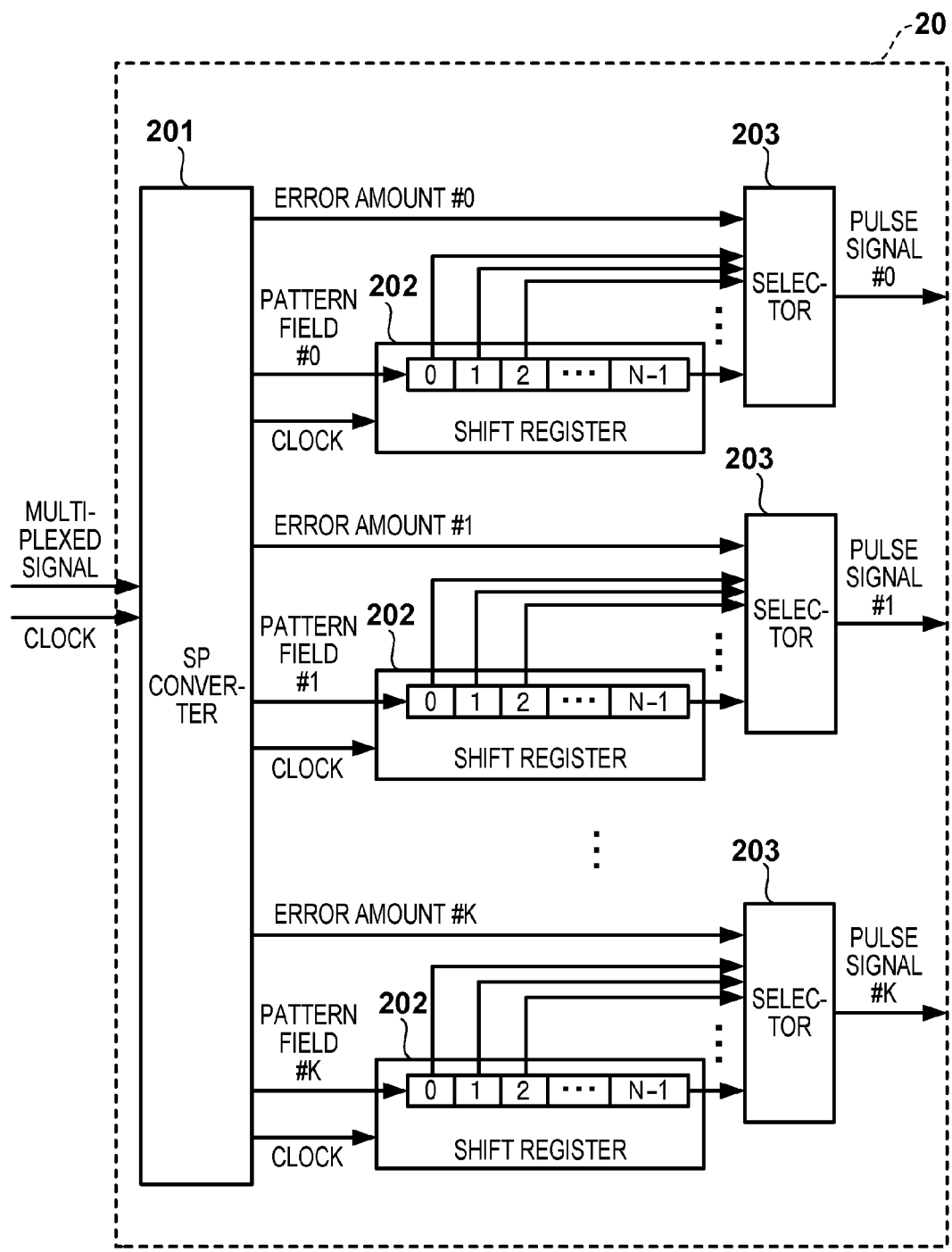
FIG. 2 shows a configuration of a reception circuit according to one embodiment.

FIG. 2 shows a configuration of the reception circuit 20. Upon receiving the frame shown in FIG. 3A or 3B, a serial-parallel (SP) converter 201 outputs the values of the pattern field to the least significant bits (LSBs) of corresponding N-bit shift registers 202. The SP converter 201 also outputs the error amounts included in the received frame to corresponding selectors 203. That is to say, the SP converter 201 functions as a demultiplexer that demultiplexes and outputs the values indicating the amplitudes of the pulse signals and the error amounts of the pulse signals included in the multiplexed signal. The SP converter 201 outputs the received clock signal to the shift registers 202.

Each shift register 202 shifts the register values in the direction toward the most significant bit (MSB) in accordance with the clock signal from the SP converter 201. The following description is given under the assumption that the LSB and MSB of each shift register 202 are the $0^{th}$ and the $(N-1)^{th}$ bits, respectively, as shown in FIG. 2. The bits in the shift registers 202 are input to the subsequent selectors 203 with N inputs and one output. The selectors 203 restore the pulse signals by selecting and outputting one bit among the N bits input from the shift registers 202 based on the error amounts from the SP converter 201. More specifically, provided that the error amount is D, each selector 203 outputs the signal having the same pulse width as the pulse width at the transmitting end by selecting and outputting the $(N-1-D)^{th}$ bit.

This is specifically described below with reference to FIGS. 4 and 5. The illustration of FIG. 4 is provided under the assumption that a pulse signal generator 101 generates and transmits a pulse signal that stays at a high level for 41 unit times and then stays at a low level for 26 unit times, with the pulse interval of the clock signal being one unit time. Note that the sampling interval is 15 unit times, and the sampling timings are indicated by solid arrows in FIG. 4. The time when the pulse signal shifts from a low level to a high level is considered as a reference time (t=0).

In this case, a counter 103 notifies the PS converter 104 of seven unit times as an error amount when t=7, and the PS converter 104 transmits a multiplexed signal including this error amount and a signal indicating that the pulse signal is at a high level to the reception circuit 20. At the sampling timings of t=22 and t=37, no change occurs to the value of the error amount, and therefore the PS converter 104 transmits a multiplexed signal including seven unit times as an error amount and a signal indicating that the pulse signal is at a high level to the reception circuit 20. At the sampling timing of t=52, the counter 103 notifies the PS converter 104 of 11 unit times as an error amount, and the PS converter 104 transmits a multiplexed signal including this error amount and a signal indicating that the pulse signal is at a low level to the reception circuit 20. At the sampling timing of t=67, the counter 103 notifies the PS converter 104 of 0 unit times as an error amount, and the PS converter 104 transmits a multiplexed signal including this error amount and a signal indicating that the pulse signal is at a high level to the reception circuit 20.

FIG. 5 shows bits in a shift register 202 of the reception circuit 20 that has received the multiplexed signal shown in FIG. 4. In FIG. 5, the number N of bits in the shift register 202 is 16. When t=7, as the signal indicating that the pulse signal is at a high level has been received, the value of the bit number 0 is "1" indicating a high level, and the other values are all "0" indicating a low level. Unless the value notified via the multiplexed signal changes, the SP converter 201 keeps outputting the same value, and therefore the values of the bit numbers 0 through 7 are all "1" when t=14, and the values of the bit numbers 0 through 8 are all "1" when t=15. When t=52, as the signal indicating a low level has been received, the value of the bit number 0 is "0" and the other values are all "1". Thereafter, the values of the bit numbers 0 through 3 are all "0" when t=55, and the values of the bit numbers 0 through 4 are all "0" when t=56. Following that, when t=67, as the signal indicating a high level has been received, the value of the bit number 0 is "1" and the other values are all "0". When t=82, all values are "1".

When t=7, the error amount D is 7, and therefore a selector 203 in the reception circuit 20 selects and reads out the value of the $(N-1-D)^{th}$ bit, namely the $8^{th}$ bit. This state lasts until when t=51. When t=52, as the error amount D has changed to 11, the value of the $(N-1-D)^{th}$ bit, namely the $4^{th}$ bit, t is selected and read out. This state lasts until when t=66. When t=67, as the error amount D has changed to 0, the value of the (N−1−D)$^{th}$ bit, namely the 15$^{th}$ bit, is selected and read out.

The bold lines in FIG. 5 indicate the bits that are read out. It can be seen that the selector 203 outputs the pulse signal that shifts from the low level to the high level when t=15, shifts to the low level when t=56, and shifts to the high level when t=82. This signal waveform is shown in FIG. 4. As is apparent from FIG. 4, the pulse width of the pulse signal output from the selector 203 is the same as the pulse width of the pulse signal generated by the pulse signal generator 101, and the fluctuations caused by sampling are compensated for. That is to say, the shift register 202 and the selector 203 form a corrector that corrects fluctuations in edge positions of a pulse signal caused by sampling based on the error amounts. It should be noted that, with the configuration shown in FIG. 1, each edge detector 102 detects the edges of the pulse signal at timings of the clock signals, and therefore errors occur in detection of an error amount in a time period between an edge and a timing of a clock signal. Similarly, in each counter 103, errors occur in detection of the sampling timings and the clock timings. However, the values of such errors are small and do not affect the control.

Figure 6:
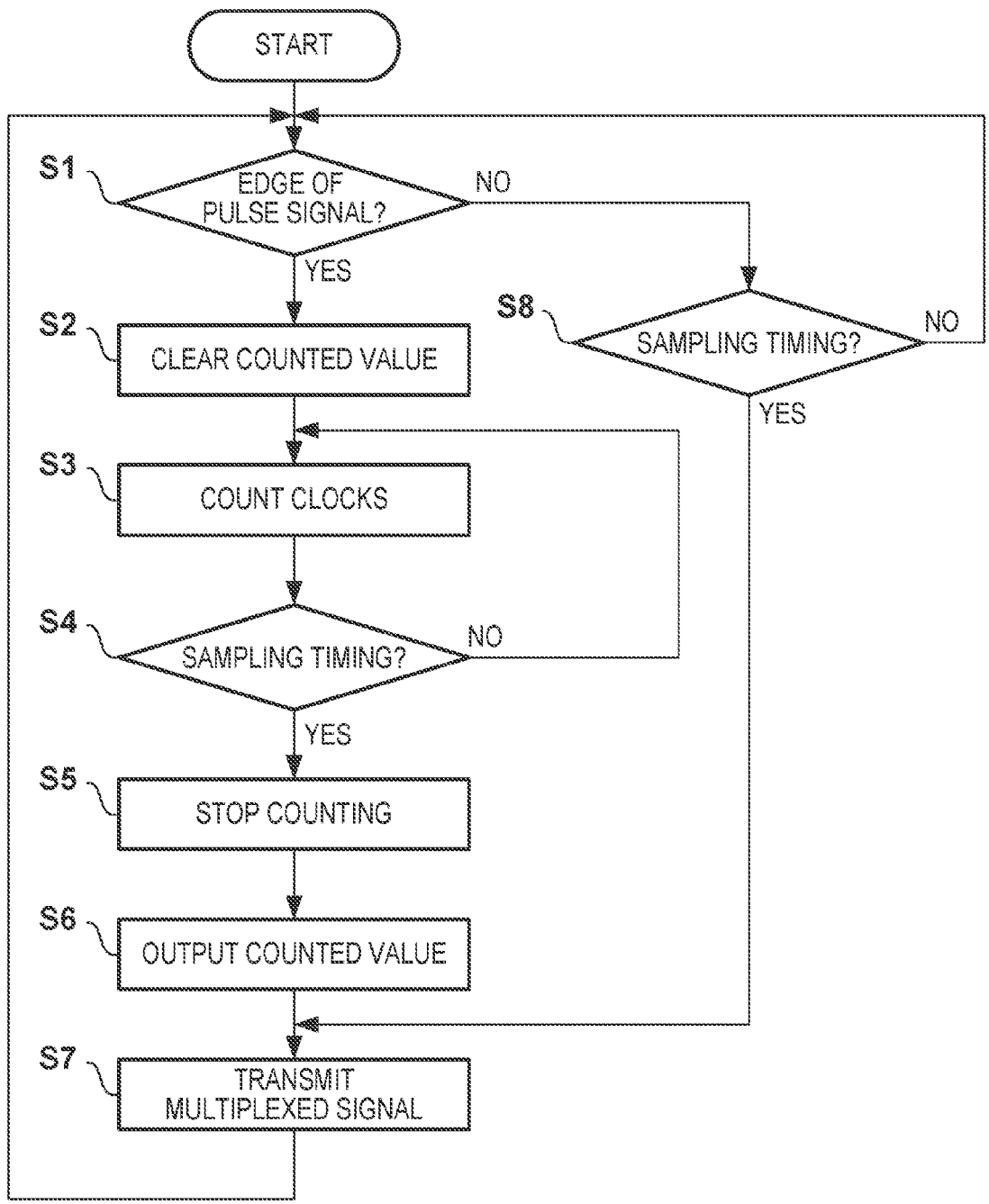
FIG. 6 is a flowchart of processing executed by a transmission circuit in one embodiment.

FIG. 6 is a flowchart of processing executed by the transmission circuit 10. Once an edge detector 102 detects an edge in S1, a counter 103 clears the count value in S2 and starts counting the clock signals in S3. The counter 103 determines whether or not it is currently the sampling timing in S4, and if not, continues the count until the sampling timing. If it is currently the sampling timing, the counter 103 stops the count in S5 and outputs the count value to the PS converter 104 in S6.

Next, in S7, the PS converter 104 determines whether a pulse signal generated by a pulse signal generator 101 is at a high level or a low level, and generates and transmits a multiplexed signal including a value indicating the determined level and the error amount notified in S6. On the other hand, when the edge is not detected in S1, the PS converter 104 determines whether or not it is currently the sampling timing in S8, and if it is currently the sampling timing, transmits the multiplexed signal in S7. At this time, the error amount is the same as the previously transmitted error amount. On the other hand, when it is not currently the sampling timing, the processing returns to S1.

Figure 7:
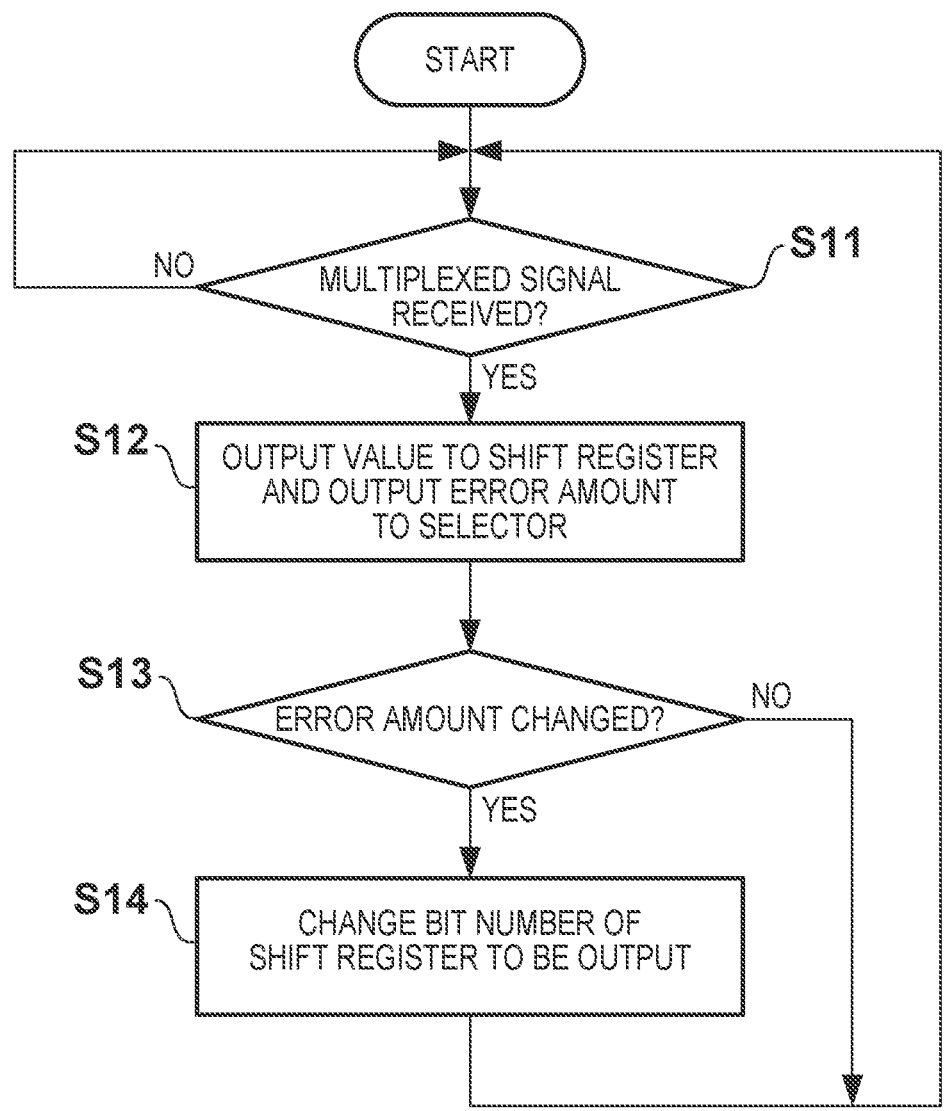
FIG. 7 is a flowchart of processing executed by a reception circuit in one embodiment.

FIG. 7 is a flowchart of processing executed by the reception circuit 20. When the SP converter 201 receives the multiplexed signal in S11, it outputs a value indicating high or low included in the multiplexed signal to a corresponding shift register 202, and outputs the error amount to a corresponding selector 203 in S12. The selector 203 determines whether or not the error amount has changed in S13, and if the error amount has changed, changes the bit number to be selected and output among the signals from the shift register 202 to the bit number corresponding to the error amount in S14. If the error amount has not changed, the currently selected bit number is maintained.

As set forth above, by detecting the error amounts of edge positions caused by sampling for each pulse signal and notifying the detected error amounts to the reception circuit, the reception circuit can compensate for fluctuations in the pulse widths caused by sampling. The error amounts can be easily calculated by measuring a delay amount occurring between an edge position of each pulse signal and the next sampling timing. Furthermore, in the reception circuit, correction can be easily made by the shift registers and selectors.

Other Embodiments

Aspects of the present invention can also be realized by a computer of a system or apparatus (or devices such as a CPU or MPU) that reads out and executes a program recorded on a memory device to perform the functions of the above-described embodiments, and by a method, the steps of which are performed by a computer of a system or apparatus by, for example, reading out and executing a program recorded on a memory device to perform the functions of the above-described embodiments. For this purpose, the program is provided to the computer for example via a network or from a recording medium of various types serving as the memory device (e.g., computer-readable medium).

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2011-173277, filed on Aug. 8, 2011, which is hereby incorporated by reference herein in its entirety.

What is claimed is:

1. An image forming apparatus having a communication system, the communication system comprising: a transmitter configured to generate and transmit a multiplexed signal for a plurality of pulse signals, the multiplexed signal including a value indicating an amplitude of each pulse signal of the plurality of pulse signals at a sampling timing; and a receiver configured to receive the multiplexed signal and output the plurality of pulse signals, wherein the transmitter comprises: a detector configured to detect an error amount of an edge position of a pulse signal caused by sampling; and a multiplexer configured to include a value indicating the detected error amount in the multiplexed signal, and the receiver comprises: a demultiplexer configured to demultiplex the multiplexed signal and output a value indicating an amplitude of the pulse signal and the value indicating the error amount of the pulse signal; and a corrector configured to correct an edge position of the pulse signal using the error amount of the pulse signal, the edge position being obtained from the value indicating the amplitude of the pulse signal output from the demultiplexer.

2. The communication system according to claim 1, wherein
the error amount of the pulse signal is a delay amount occurring between detection of the edge position of the pulse signal and detection of a sampling timing that follows the edge position.

3. The communication system according to claim 1, wherein
the detector is further configured to count the error amount using a clock signal,
the transmitter is further configured to transmit the clock signal to the receiver, and
the corrector comprises:
a shift register configured to receive an input of the value indicating the amplitude of the pulse signal included in the multiplexed signal and shift the value in accordance with the clock signal; and
a selector configured to output one register value specified by the error amount from among a plurality of register values of the shift register.

4. An image forming apparatus according to claim 1, wherein a plurality of pulse motors for conveying recording materials are respectively controlled by a plurality of pulse signals output from the receiver.

* * * * *